United States Patent [19]

Fukuoka

[11] 3,893,043

[45] July 1, 1975

[54] ASTABLE MULTIVIBRATOR CIRCUIT

[75] Inventor: Toshimi Fukuoka, Tokyo, Japan

[73] Assignee: Sony Corporation, Tokyo, Japan

[22] Filed: Apr. 9, 1974

[21] Appl. No.: 459,262

[30] Foreign Application Priority Data

Apr. 13, 1973 Japan ................................ 48-44473

[52] U.S. Cl. .................... 331/113 R; 321/2; 321/18; 331/62

[51] Int. Cl. ............................................ H03k 3/282

[58] Field of Search ............. 331/113, 62; 321/2, 18

*Primary Examiner*—John Kominski
*Attorney, Agent, or Firm*—Lewis H. Eslinger; Alvin Sinderbrand

[57] ABSTRACT

In an astable multivibrator circuit comprising first and second active elements, for example, each constituted by a transistor having base, collector and emitter electrodes, sources of relatively high and low potential respectively connected to the collector electrodes and to the emitter electrodes of said first and second transistors, a first capacitor connecting the collector electrode of said first transistor to the base electrode of said second transistor and a second capacitor connecting the collector electrode of said second transistor to the base electrode of said first transistor for normally causing said first and second transistors to alternatively and reciprocally conduct current in the respective collector-emitter paths thereof, and a signal output terminal connected with the collector electrode of at least one of said first and second transistors for providing an output signal in dependence on the conducting of currents in said collector-emitter paths; malfunction production is afforded by a current detector, for example, constituted by a resistor interposed between the low potential source and the emitter electrodes of said first and second transistors, for conducting a current which, at any time, is the total of the currents conducted through the collector-emitter paths of said first and second transistors, a third transistor having base, collector and emitter electrodes, the base electrode of said third transistor receiving a potential which varies with the magnitude of the current conducted by the resistor, and the collector and emitter electrodes of the third transistor are respectively connected with the base electrode of the other of said first and second transistors and with the low potential source, so that the third transistor is operative to render the collector-emitter path of said other transistor non-conductive when the current conducted by the resistor exceeds a predetermined value either by reason of the first and second transistors being accidentally in their conductive state simultaneously, or by reason of the difference between the high and low potentials being excessive.

8 Claims, 4 Drawing Figures

ASTABLE MULTIVIBRATOR CIRCUIT

BACKGROUND OF THE INVENTION

1. Field of the Invention

This invention relates generally to astable multivibrator circuits, and more particularly is directed to improvements in such circuits which prevent the malfunctioning thereof.

2. Description of the Prior Art

Astable multivibrator circuits are well known for use as square wave generators or oscillators in many different kinds of electrical or electronic equipment. Such astable multivibrator circuits usually include a pair of active elements which may be constituted by transistors, electron tubes and the like, and which are normally rendered conductive and non-conductive in an alternative and reciprocal manner, with output signals of square waveform being obtained from the output electrode of at least one of the active elements.

However, in such existing astable multivibrator circuits, it relatively frequently happens that both of the active elements are accidentally made conductive simultaneously and held in that conductive state with the result that the multivibrator circuit no longer performs its desired function as a square wave generator or oscillator.

Further, with such existing astable multivibrator circuits, the oscillation operation thereof continues regardless of the value of the power supply voltage applied thereto and this is undesirable, for example, when the astable multivibrator circuit is used for voltage level controlling in a so-called "chopping" type DC-DC converter circuit.

SUMMARY OF THE INVENTION

Accordingly, it is a general object of this invention to provide an astable multivibrator circuit which avoids the above described disadvantages of the previously known circuits of that type.

More particularly, it is an object of this invention to provide an astable multivibrator circuit which is protected against malfunctioning thereof.

Another object is to provide an improved astable multivibrator circuit in which stoppage of the oscillating operation of the circuit is avoided when both active elements of the circuit are accidentally made conductive simultaneously.

A further object is to provide an improved astable multivibrator circuit, as aforesaid, in which the oscillation of the circuit is halted when the power supply voltage applied thereto exceeds a predetermined value.

A still further object is to provide an astable multivibrator circuit which is particularly suited to be utilized for voltage level controlling in a so-called "chopping" type DC-DC converter circuit.

In accordance with an aspect of this invention, an astable multivibrator circuit having a pair of active elements, such as transistors, which are normally rendered conductive and non-conductive alternatively and reciprocally, is provided with a current detector, for example, in the form of a resistor, for detecting a total current flowing through the pair of active elements at any time, and with means responsive to the current detector for rendering one of the pair of active elements non-conductive when the total current detected by the current detector exceeds a predetermined value. Thus, of both of the active elements or transistors are accidentally made conductive simultaneously at a time when the power supply voltage applied to the circuit is within a normal range, the total current detected by the current detector exceeds the predetermined value with the result that one of the active elements is returned to its non-conductive state for restoring or restarting the oscillation of the circuit. On the other hand, if the power supply voltage applied to the circuit rises above the normal range while the circuit is oscillating, the current detected by the current detector again rises above the predetermined value so that one of the active elements is rendered non-conductive to halt the oscillation of the circuit.

The above, and other objects, features and advantages of this invention, will be apparent in the following detailed description of an illustrative embodiment of the invention which is to be read in connection with the accompanying drawings.

DETAILED DESCRIPTION OF AN ILLUSTRATIVE EMBODIMENT OF THE INVENTION

Figure 1:
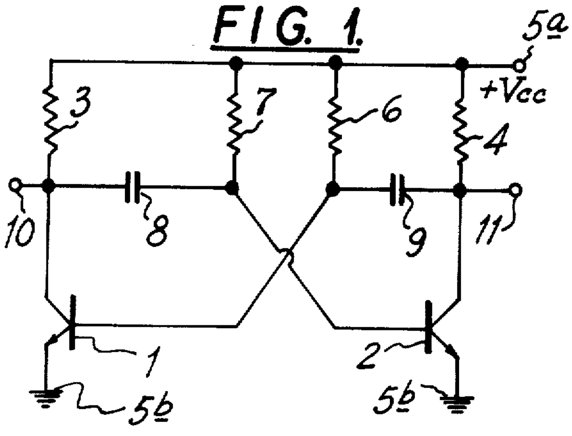
FIG. 1. PRIOR ART
FIG. 1 is a circuit diagram showing a typical astable multivibrator circuit according to the prior art.

Referring to the drawings in detail, and initially to FIG. 1 thereof, it will be seen that the conventional astable multivibrator circuit is there shown to generally comprise a pair of active elements 1 and 2 which, as shown, may be constituted by respective transistors each having base, collector and emitter electrodes. The collector electrodes of transistors 1 and 2 are connected through resistors 3 and 4, respectively, to a terminal 5*a* which, for example, constitutes a source of relatively high potential $+V_{cc}$, while the emitter electrodes of transistors 1 and 2 are connected, as at 5*b*, to ground which, for example, constitutes a source of relatively low or reference potential. The base electrodes of transistors 1 and 2 are connected through resistors 6 and 7, respectively, to terminal 5*a*. Further, a capacitor 8 is connected between the collector electrode of transistor 1 and the base electrode of transistor 2, and a capacitor 9 is similarly connected between the collector electrode of transistor 2 and the base electrode of transistor 1. Finally, signal output terminals 10 and 11 are shown to be connected to the collector electrodes of transistors 1 and 2, respectively.

The operation of the conventional astable multivibrator circuit of FIG. 1 is well known and need not be described in detail. However, it will be understood that the transistors 1 and 2 are normally rendered conductive and non-conductive in an alternative and reciprocal manner so that output signals of square waveform are obtained at the output terminals 10 and 11. In such operation of the circuit shown on FIG. 1, the time period during which transistor 1 is conductive is determined by the time constant of resistor 7 and capacitor 8, and the time period during which transistor 2 is conductive is similarly determined by the time constant of resistor 6 and capacitor 9. Although the astable multivibrator circuit shown on FIG. 1 has found widespread use as a square wave generator or oscillator in many different types of electronic and electrical equipment, such circuit has the following disadvantages.

First of all, if both transistors 1 and 2 are accidentally made conductive simultaneously and held in the conductive state, as is relatively frequently the case, the oscillation of the circuit is halted. Secondly, the described conventional circuit continues to operate as an oscillator even when the power supply voltage $+V_{cc}$ applied to terminal 5*a* becomes extremely high. The foregoing disadvantages are particularly undesirable when the conventional astable multivibrator circuit is used for voltage level controlling in a so-called chopping type DC-DC converter circuit.

Figure 2:
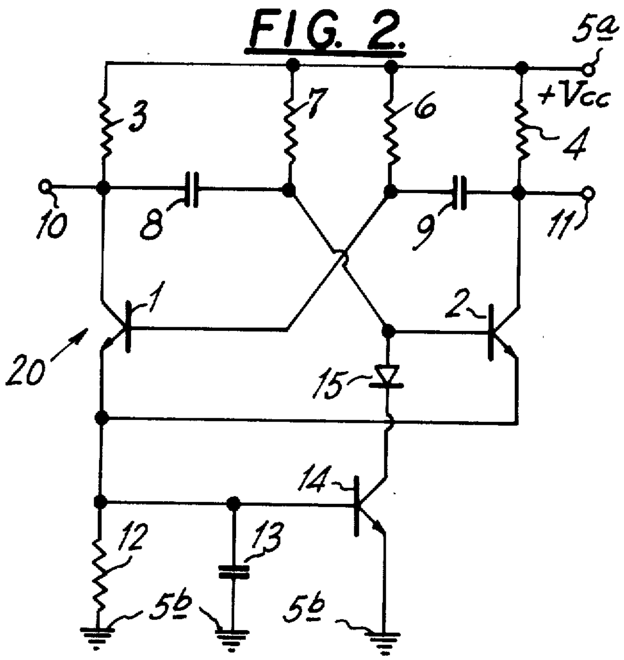
FIG. 2 is a circuit diagram of an astable multivibrator circuit according to an embodiment of the present invention.

Referring now to FIG. 2, in which circuit elements corresponding to those described above with reference to FIG. 1 are identified by the same reference numerals, it will be seen that, in an astable multivibrator circuit 20 according to this invention, the previously mentioned disadvantages of the conventional circuit are avoided by connecting the emitter electrodes of both transistors 1 and 2 to ground through a resistor 12 so that the current flowing through the latter at any time will be the total of the emitter currents of both transistors 1 and 2. Thus, resistor 12 functions as a current detector. A capacitor 13 is connected in parallel with resistor 12 to ground, and a transistor 14 constituting a third active element has its collector electrode connected to the base electrode of transistor 2 through a diode 15, while the emitter electrode of transistor 14 is connected to ground and the base electrode of transistor 14 is connected to the emitter electrodes of transistors 1 and 2.

The astable multivibrator circuit 20 according to this invention, as shown on FIG. 2, operates as follows:

During normal operation of the circuit 20, that is, when transistors 1 and 2 are rendered conductive and non-conductive in an alternative and reciprocal manner and the supply voltate $+V_{cc}$ applied to terminal 5*a* is within a predetermined range, the current flowing through resistor 12 at any one time is equal to the emitter current of either the transistor 1 or the transistor 2, and the value of this detected current, and thus the voltage drop across resistor 12, is made small enough so as to hold transistor 14 in its non-conductive state by suitably selecting the values of resistors 3,4 and 12. With transistor 14 being held in its non-conductive state, it will be apparent that the operation of the circuit shown on FIG. 2 is substantially equivalent to that of the conventional circuit of FIG. 1.

However, in the event that both transistors 1 and 2 are accidentally made conductive simultaneously, the current flowing through resistor 12 is very substantially increased, that is, becomes equal to the total of the emitter currents of both transistors 1 and 2, and the resulting increased voltage drop across resistor 12 makes transistor 14 conductive. When transistor 14 is thus made conductive, the potential applied to the base electrode of transistor 2 is substantially decreased, with the result that transistor 2 is made non-conductive. Once transistor 2 is made non-conductive, the circuit returns to its normal condition and its usual operation as an oscillator is restarted with transistors 1 and 2 being again rendered conductive and non-conductive in the desired alternative and reciprocal manner.

It will be apparent that, during the normal oscillating operation of circuit 20, both transistors 1 and 2 are momentarily in their conductive states during the change-over of one of transistors 1 and 2 from its conductive state to its non-conductive state and the simultaneous change-over of the other of transistors 1 and 2 from its non-conductive state to its conductive state. However, such normal momentary or fleeting occurrence of the conductive states of both transistors 1 and 2 does not cause operation of transistor 14 by reason of capacitor 13 which functions as part of a time constant circuit Thus, transistor 14 is operated or made conductive for changing over transistor 2 to its non-conductive state only when transistors 1 and 2 are simultaneously in their conductive states for at least a predetermined time period. Further, during normal operation of circuit 20, that is, when transistors 1 and 2 are rendered conductive and non-conductive in the normal alternative and reciprocal manner, diode 15 prevents the flow of a reverse current from the collector electrode of transistor 14 to the base electrode of transistor 2.

If the voltage $+V_{cc}$ applied to terminal 5*a* becomes excessive during normal oscillating operation of circuit 20, the emitter current of either one of transistors 1 and 2, that is, the current flowing through resistor 12, increases sufficiently to render transistor 14 conductive, with the result that transistor 2 is made non-conductive for so long as the voltage applied to terminal 5*a* is excessive. Thus, in response to an excessive voltage applied to terminal 5*a*, transistor 2 is maintained nonconductive and transistor 1 is maintained conductive for halting the oscillation of the circuit.

Figures 3, 4:
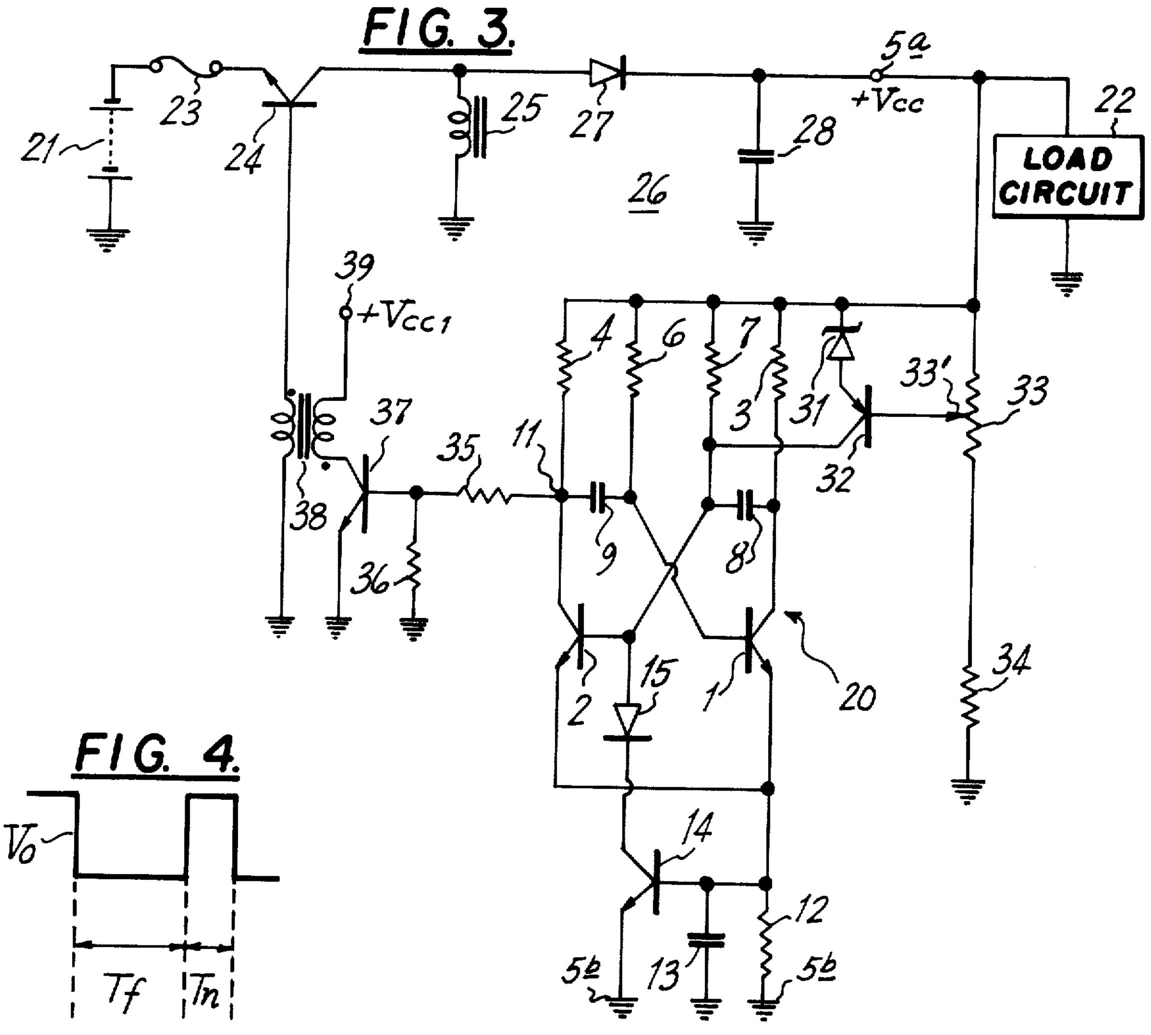
FIG. 3 is a circuit diagram illustrating the use of the astable multivibrator circuit of FIG. 2 for voltage level controlling in a chopping type DC-DC converter circuit.
FIG. 4 is a waveform diagram to which reference will be made in explaining the operation of the circuit shown on FIG. 3.

Although astable multivibrator circuit 20 according to this invention has many applications, the described malfunction preventing features thereof can be particularly utilized for protection of a load circuit when such astable multivibrator circuit is employed for voltage level controlling in a so-called chopping type DC-DC converter circuit, for example, as illustrated on FIG. 3.

It will be seen that the several circuit elements of circuit 20 according to this invention are identified on FIG. 3 by the same reference numerals used in association therewith on FIG. 2, and that the circuit of FIG. 3 additionally includes a DC power supply 21 and a load circuit 22 which may be a television receiver. The power supply 22 is shown to be connected to the emitter electrode of a switching or chopping transistor 24 through a fuse 23, while the collector electrode of transistor 24 is connected to ground through a choke coil 25. The collector electrode of transistor 24 is also connected to a rectifying circuit 26 which includes a diode 27 and a capacitor 28, and a junction point between diode 27 and capacitor 28 leads to the terminal 5*a* to which load circuit 22 is connected for receiving an operational voltage $+V_{cc}$ therefrom. The astable multivibrator circuit 20 according to this invention also receives its operational voltage from rectifying circuit 26 at terminal 5*a*. A Zener diode 31 and the emitter-collector path of a transistor 32 form a series circuit in parallel with resistor 7 of circuit 20, and the base electrode of transistor 32 is connected to the movable tap 33' of a variable resistor 33. Variable resistor 33 is connected in series with a resistor 34 between terminal 5*a* and ground so that variable resistor 33 and resistor 34 provide a voltage divider for determining the base potential applied to transistor 32.

The output terminal 11 of circuit 20 is connected to the base electrode of a transistor 37 through a voltage divider formed by resistors 35 and 36. The collector-emitter path of transistor 37 is connected in series with the primary winding of a transformer 38 between ground and a terminal 39 which receives a DC supply voltage $+V_{cc1}$, for example, from the so-called flyback transformer which is conventionally included in load circuit 22 when the latter is constituted by a television receiver. The secondary winding of transformer 38 is shown to be connected between the base electrode of transistor 24 and ground.

The circuit illustrated on FIG. 3 operates as a so-called chopping type DC-DC converter circuit in which the oscillation output of astable multivibrator circuit 20 is applied to switching transistor 24 by way of transistor 37 and transformer 38, with the polarity of transformer 38 being selected so that transistor 24 is rendered conductive and non-conductive simultaneously with transistor 37. The waveform $V_o$ on FIG. 4 represents the output signal applied from terminal 11 of circuit 20 to the base electrode of transistor 37, with the result that transistor 37 is made non-conductive during the period $T_f$ and conductive during the period $T_n$, and transistor 24 is similarly made non-conductive and conductive during the periods $T_f$ and $T_n$, respectively.

In response to such changing-over of transistor 24 between its conductive and non-conductive states, choke coil 25 is intermittently connected to DC power supply source 21, that is, choke coil 25 is connected to DC power supply source 21 only during each time period $T_n$ of waveform $V_o$ when transistor 24 is in its conductive state. On the other hand, when transistor 24 is in its non-conductive state during each time period $T_f$ of waveform $V_o$, choke coil 25 is disconnected from DC power supply source 21 and rectifying circuit 26 is then supplied with current from choke coil 25.

It will be apparent that the period $T_f$ of waveform $V_o$ during which transistors 24 and 37 are non-conductive corresponds to the period during which transistor 2 is in its conductive state, and such time period $T_f$ is maintained constant as it is predetermined by the time constant of resistor 6 and capacitor 9 in circuit 20. On the other hand, the time period $T_n$ during which transistors 24 and 37 are conductive corresponds to the period during which transistor 2 is in its non-conductive state and transistor 1 is in its conductive state, and such time period $T_n$ depends on the time constant determined by the equivalent impedance of resistor 7, Zener diode 31 and the emitter-collector impedance of transistor 32, and by capacitor 8.

It will be further apparent that, when there is a change in the output voltage $+V_{cc}$ of rectifying circuit 26 appearing at terminal *5a*, for example, when the voltage $+V_{cc}$ increases, this voltage increase is detected by variable resistor 33, and the emitter-base junction of transistor 32 is more forwardly biased with the result that the conductivity of transistor 32 is increased. Such increase in the conductivity of transistor 32 decreases the equivalent impedance of resistor 7, Zener diode 31 and the emittercollector impedance of transistor 32, with the result that the period $T_n$ during which transistor 24 is in its conductive state is reduced or shortened. Conversely, when output voltage $+V_{cc}$ of rectivying circuit 26 is decreased, the forward bias of the emitter-base junction of transistor 32 is reduced and the conductivity of transistor 32 is decreased, with the result that the period $T_n$ during which transistor 24 is in its conductive state is increased or lengthened.

From the foregoing, it will be seen that, in the circuit of FIG. 3, each period $T_f$ during which transistor 24 is in its non-conductive state is maintained constant, while each period $T_n$ during which transistor 24 is in its conductive state is controlled so that the period $T_n$ is reduced in response to an increase in the output voltage of rectifying circuit 26 and the period $T_n$ is increased in response to a decrease in the output voltage of rectifying circuit 26. Thus, the circuit of FIG. 3 operates to maintain the output voltage $+V_{cc}$ of rectifier 26 at a substantially constant level. During such operation of the circuit shown on FIG. 3, if both transistors 1 and 2 of astable multivibrator circuit 20 are accidentally made conductive simultaneously so as to tend to stop the oscillation of circuit 20 and thereby cause the output voltage of rectifying circuit 26 to fall or decrease, transistor 14 operates or is made conductive so as to automatically restart the oscillation of circuit 20, as previously described with reference to FIG. 2, whereby the output voltage $+V_{cc}$ of rectifying circuit is maintained constant.

In the event that the equivalent impedance of resistor 7, Zener diode 31 and emitter-collector impedance of transistor 32 undergoes an extreme accidental increase, such as, for example, when Zener diode 31 or transistor 32 is damaged, each time period $T_n$ during which transistor 24 is in its conductive state becomes extremely long with the result that the output voltage $+V_{cc}$ of rectifying circuit 26 becomes extremely high. Such extremely high voltage $+V_{cc}$ applied to circuit 20 according to this invention causes a correspondingly great increase in the emitter current of either transistor 1 or transistor 2 with the result that the voltage drop across the resistor 12 becomes large enough to change-over transistor 14 to its conductive state and, accordingly, transistor 2 is switched-over and maintained in its non-conductive state. In response to transistor 2 being thus maintained in its non-conductive state so long as the voltage $+V_{cc}$ is excessively high, transistor 24 is maintained in its conductive state with the result that fuse 23 eventually blows or is cut off for separating DC power supply source 21 from the remainder of the circuit. Thus, load circuit 22 is protected from the damage that might otherwise be caused therein by reason of the continued application thereto of an excessively high voltage at terminal *5a*. From the foregoing, it will be seen that the malfunction preventing features of the astable multivibrator circuit 20 according to this invention make the latter particularly suited for voltage level controlling in a so-called chopping type DC-DC converter circuit.

Although an illustrative embodiment of this invention has been described in detail herein with reference to the accompanying drawings, it is to be understood that the invention is not limited to that precise embodiment, and that various changes and modifications may be effected therein by one skilled in the art without departing from the scope or spirit of the invention, as defined in the appended claims.

What is claimed is:

1. An astable multivibrator circuit comprising first and second circuit elements each having conductive and non-conductive states, voltage source means, means connecting said first and second circuit elements with each other and with said voltage source means for normally causing said first and second circuit elements to alternatively and reciprocally assume said conductive states thereof, signal output means connected with at least one of said first and second circuit elements for providing an output signal in dependence on said conductive and non-conductive states of said circuit elements, current detecting means connected with said first and second circuit elements for detecting a total current flowing through the latter when in said conductive state, and means for causing one of said first and second circuit elements to assume said non-conductive state when said total current detected by said current detecting means exceeds a predetermined value either by reason of said first and second circuit elements being accidentally in said conductive state simultaneously or by reason of an excessive voltage at said voltage source means.

2. An astable multivibtator circuit comprising first and second second active elements each having conductive and non-conductive states and including control, common and output electrodes, first and second voltage terminals for connection to a power supply source, means connecting said first voltage terminal to the output electrodes of said first and second active elements, respectively, means including a first capacitor connecting the output electrode of said first active element to the control electrode of said second active element, means including a second capacitor for connecting the output electrode of said second active element to the control electrode of said first active element, current detecting means connected between said common electrodes of said first and second active elements and said second voltage terminal for detecting a total current flowing through said common electrodes of the first and second active elements in said conductive state thereof, means connected between said detecting means and one of said first and second active elements for causing said one active element to assume said non-conductive state when said total current detected by said current detecting means exceeds a predetermined value, and signal output means connected with the output electrode of at least one of said first and second active elements for providing an output signal in dependence on said conductive and non-conductive states of said active elements.

3. An astable multivibrator circuit according to claim 2, in which said means connected between said detecting means and one of said first and second active elements includes a third active element having conductive and non-conductive states and control, common and output electrodes, said control electrode of the third active element is connected to said detecting means, and said common and output electrodes of said third active element are respectively connected to said second voltage terminal and to said control electrode of said one of the first and second active elements.

4. An astable multivibrator circuit according to claim 3, in which said detecting means includes a resistor connected between said common electrodes of the first and second active elements and said second voltage terminal.

5. An astable multivibrator circuit according to claim 4, in which said first, second and third active elements are transistors, respectively, and said control, common and output electrodes of each of said active elements are base, emitter and collector electrodes of the respective transistor.

6. An astable multivibrator circuit according to claim 2, in which said detecting means includes a resistor connected between said common electrodes of the first and second active elements and said second voltage terminal.

7. In an astable multivibrator circuit comprising first and second transistors each having base, collector and emitter electrodes, means constituting sources of relatively high and low potential, respectively, means connecting one of said sources to the collector electrodes of said first and second transistors, means connecting the other of said sources to the emitter electrodes of said first and second transistors, means including a first capacitor connecting the collector electrode of said first transistor to the base electrode of said second transistor and a second capacitor connecting the collector electrode of said second transistor to the base electrode of said first transistor for normally causing said first and second transistors to alternatively and reciprocally conduct current in the respective collector-emitter paths thereof, and signal output means connected with the collector electrode of at least one of said first and second transistors for providing an output signal in dependence on the conducting of currents in said collector-emitter paths; the improvement comprising a resistor interposed in said means connecting said other source with said emitter electrodes of said first and second transistors for conducting a current which, at any time, is the total of said currents conducted through said collector-emitter paths of said first and second transistors, a third transistor having base, collector and emitter electrodes, means for applying to the base electrode of said third transistor a potential which varies with the magnitude of said current conducted by said resistor, and means connecting said collector and emitter electrodes of said third transistor with the base electrode of the other of said first and second transistors and with said other source, respectively, so that said third transistor is operative to render the collector-emitter path of said other transistor non-conductive when the current conducted by said resistor exceeds a predetermined value.

8. An astable multivibrator circuit according to claim 7; in which a capacitor is connected between said base electrode of the third transistor and said other source in parallel with said resistor to prevent operation of said third transistor when the current conducted by said resistor only momentarily exceeds said predetermined value.

* * * * *